(12) United States Patent
Li

(10) Patent No.: US 6,796,373 B1
(45) Date of Patent: Sep. 28, 2004

(54) HEAT SINK MODULE

(75) Inventor: Chin-Yuan Li, Taipei (TW)

(73) Assignee: Inventec Corporation, Taipei (TW)

( * ) Notice: Subject to any disclaimer, the term of this patent is extended or adjusted under 35 U.S.C. 154(b) by 0 days.

(21) Appl. No.: 10/648,335

(22) Filed: Aug. 27, 2003

(51) Int. Cl.$^7$ .......................................... F28D 15/00
(52) U.S. Cl. ........................ 165/104.21; 165/104.33; 165/80.3; 361/700; 174/15.2; 257/714
(58) Field of Search ................ 165/104.21, 104.26, 165/104.33, 185; 361/699, 700; 174/15.2; 257/714–716

(56) References Cited

U.S. PATENT DOCUMENTS

| | | | | |
|---|---|---|---|---|
| 5,699,853 A | * | 12/1997 | Goth et al. ............ | 165/104.21 |
| 6,102,110 A | * | 8/2000 | Julien et al. ........... | 165/104.33 |
| 6,394,175 B1 | * | 5/2002 | Chen et al. ................ | 165/80.3 |
| 6,469,894 B2 | * | 10/2002 | Ubukata ..................... | 361/700 |
| 6,542,364 B2 | * | 4/2003 | Lai et al. ..................... | 361/697 |
| 6,625,021 B1 | * | 9/2003 | Lofland et al. ............. | 361/697 |
| 6,651,734 B1 | * | 11/2003 | Liu ............................ | 165/80.3 |
| 2003/0019610 A1 | * | 1/2003 | Liu ............................ | 165/80.3 |
| 2003/0141041 A1 | * | 7/2003 | Chen ......................... | 165/80.3 |
| 2003/0173061 A1 | * | 9/2003 | Lai et al. ................... | 165/80.4 |
| 2003/0230398 A1 | * | 12/2003 | Lee et al. .............. | 165/104.21 |
| 2004/0035558 A1 | * | 2/2004 | Todd et al. ............ | 165/104.26 |
| 2004/0074633 A1 | * | 4/2004 | Liu ............................ | 165/80.3 |

* cited by examiner

*Primary Examiner*—Terrell McKinnon
(74) *Attorney, Agent, or Firm*—Bacon & Thomas

(57) ABSTRACT

The present invention is to provide a heat sink module comprising a base; a first heat conduction block located on the middle of a first side of the base a second heat conduction block located on the middle of a second side of the base corresponding to the first heat conduction block; at least one heat conduction tube installed in the base between the first and second heat conduction blocks, the at least one heat conduction tube each having two distal ends curved in one direction and respectively inserted into the first and second heat conduction blocks; and a plurality of radiation fins located on two sides of the base and connected between the first and second heat conduction blocks, the radiation fins each having two ends respectively extended to two sides of the base for enabling the base to be installed in a heat source.

5 Claims, 3 Drawing Sheets

HEAT SINK MODULE

BACKGROUND OF THE INVENTION

1. Field of the Invention

The present invention relates to a heat sink module and, more particularly, to a compact heat sink module which requires less installation space and, achieves a satisfactory heat dissipation effect.

2. Description of the Related Art

Following fast development of electronic technology, a variety of sophisticated electronic and communication devices have been continuously disclosed. The creation of small-size multi-function CPUs (Central Processing Units) act an important role in the development of compact, thin, and delicate electronic products.

The CPU of a computer is the operation center, which is the most impart part of the computer. Following fast development of IC manufacturing techniques, modern CPUs have better and faster operation and calculation power. A CPU having a relatively faster speed produces a relatively bigger amount of heat. During running of a computer, heat must be quickly carried away from the CPU. Excessive high temperature affects the stability of the operation of the computer. Various heat sink modules have been disclosed for use in a computer to dissipate heat from the CPU.

FIG. 1 shows a heat sink module according to the prior art. According to this design, the heat sink module is comprised of a plurality of radiation fins 12, a heat conduction copper block 14, and a heat conduction copper tube 16. The radiation fins 12 are located on one side of the heat conduction copper block 14. The heat conduction copper tube 16 has one end fastened to the heat conduction copper block 14 and the other end curved and then fastened to the radiation fins 12. When in use, the heat conduction copper block 14 is closely attached to the CPU to absorb heat from the CPU, for enabling absorbed heat to be transferred to the radiation fins 12 through the heat conduction copper tube 16 and the connection area between the heat conduction copper block 14 and the radiation fins 12 and then dissipated into the air from the radiation fins 12.

This design of heat sink module has drawbacks. Because the heat conduction copper tube 16 has a part curved and extended to the outside, the heat sink module requires much installation space, not in conformity with the requirements for a lighter, thinner, shorter, and smaller product design.

SUMMARY OF THE INVENTION

The present invention has been accomplished under the circumstances in view. It is therefore the main object of the present invention to provide a heat sink module, which requires less installation space. To achieve this and other objects of the present invention, the heat sink module comprises a base; a first heat conduction block located on the middle of a first side of the base, a second heat conduction block located on the middle of a second side of the base corresponding to the first heat conduction block; at least one heat conduction tube installed in the base between the first heat conduction block and the second heat conduction block, the at least one heat conduction tube each having two distal ends curved in one direction and respectively inserted into the first heat conduction block and the second heat conduction block; and a plurality of radiation fins located on two sides of the base and connected between the first heat conduction block and the second beat conduction block, the radiation fins each having two ends respectively extended to two sides of the base for enabling the base to be installed in a heat source.

DETAILED DESCRIPTION OF THE PREFERRED EMBODIMENT

Figure 1:
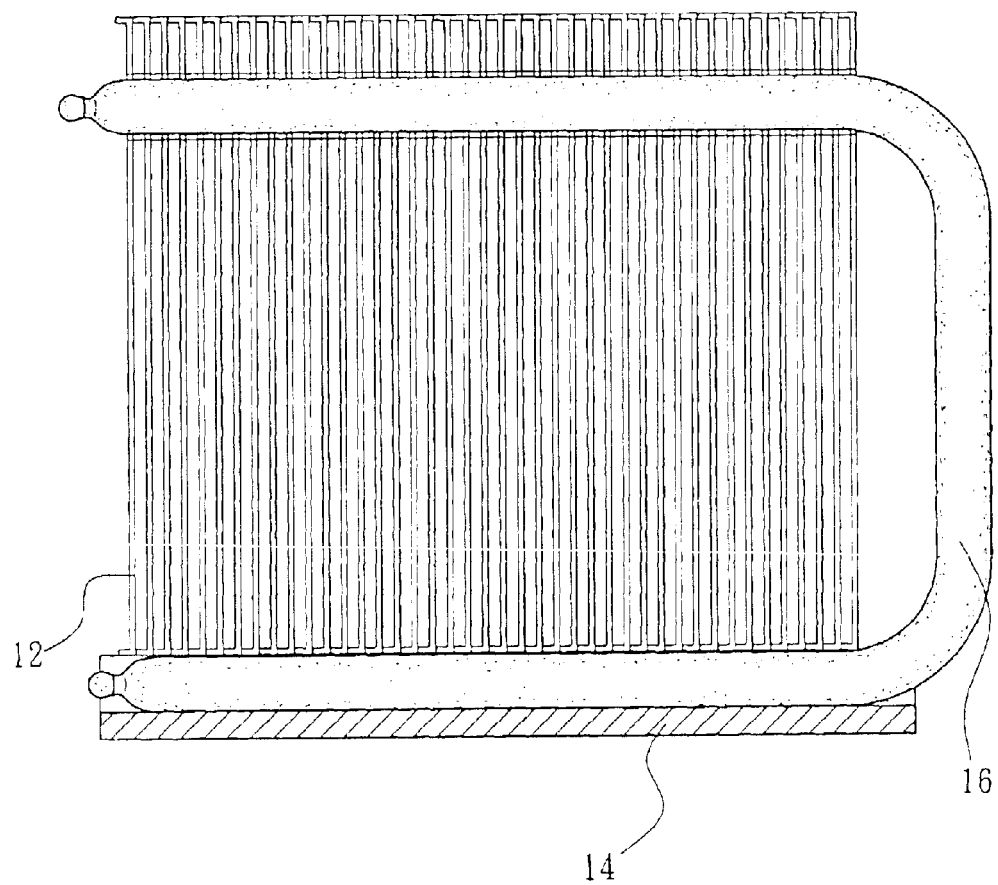
FIG. 1 is a sectional view of a heat sink module according to the prior art.
Figure 2:
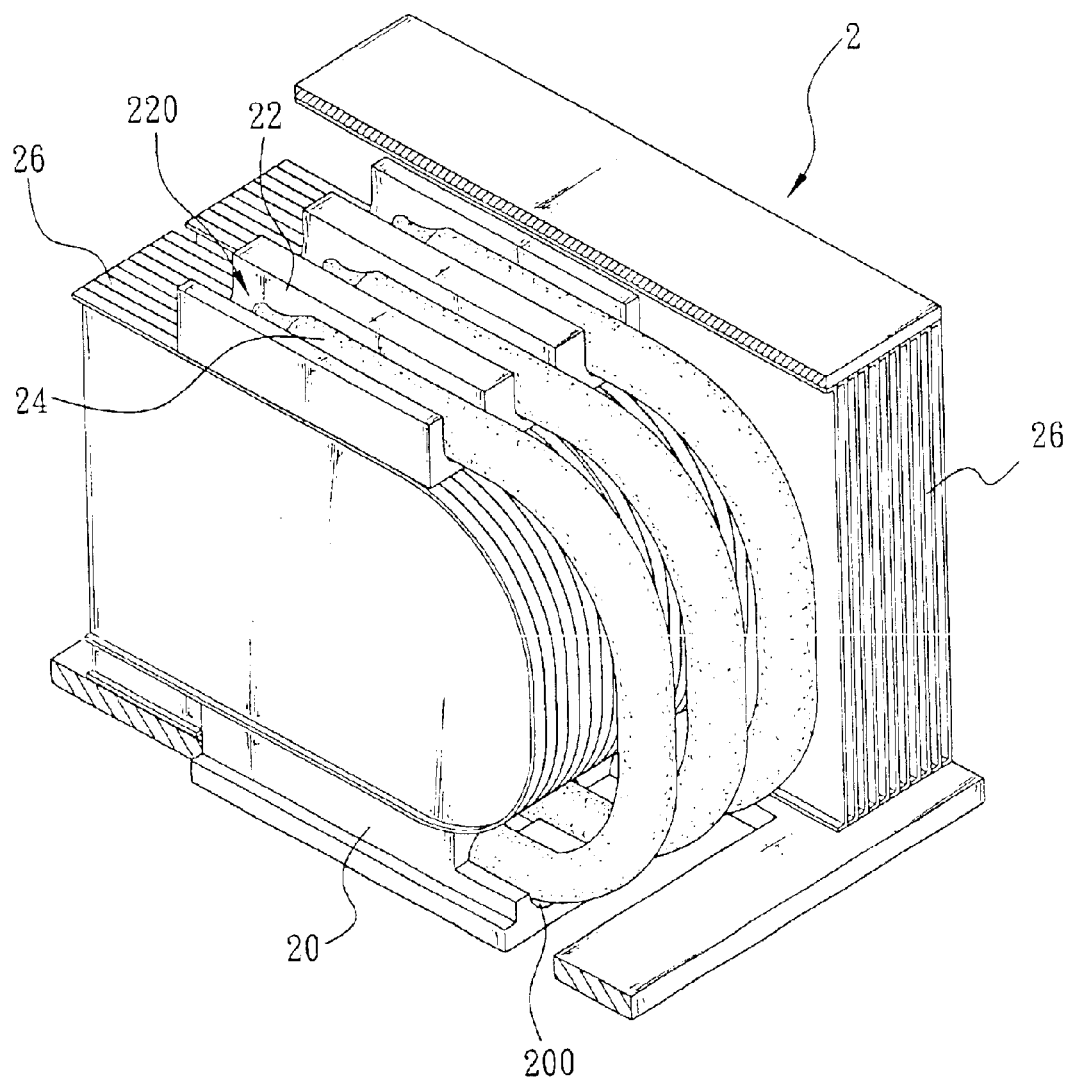
FIG. 2 is an elevational view, partially in section, of a heat sink module according to the present invention.
Figure 3:
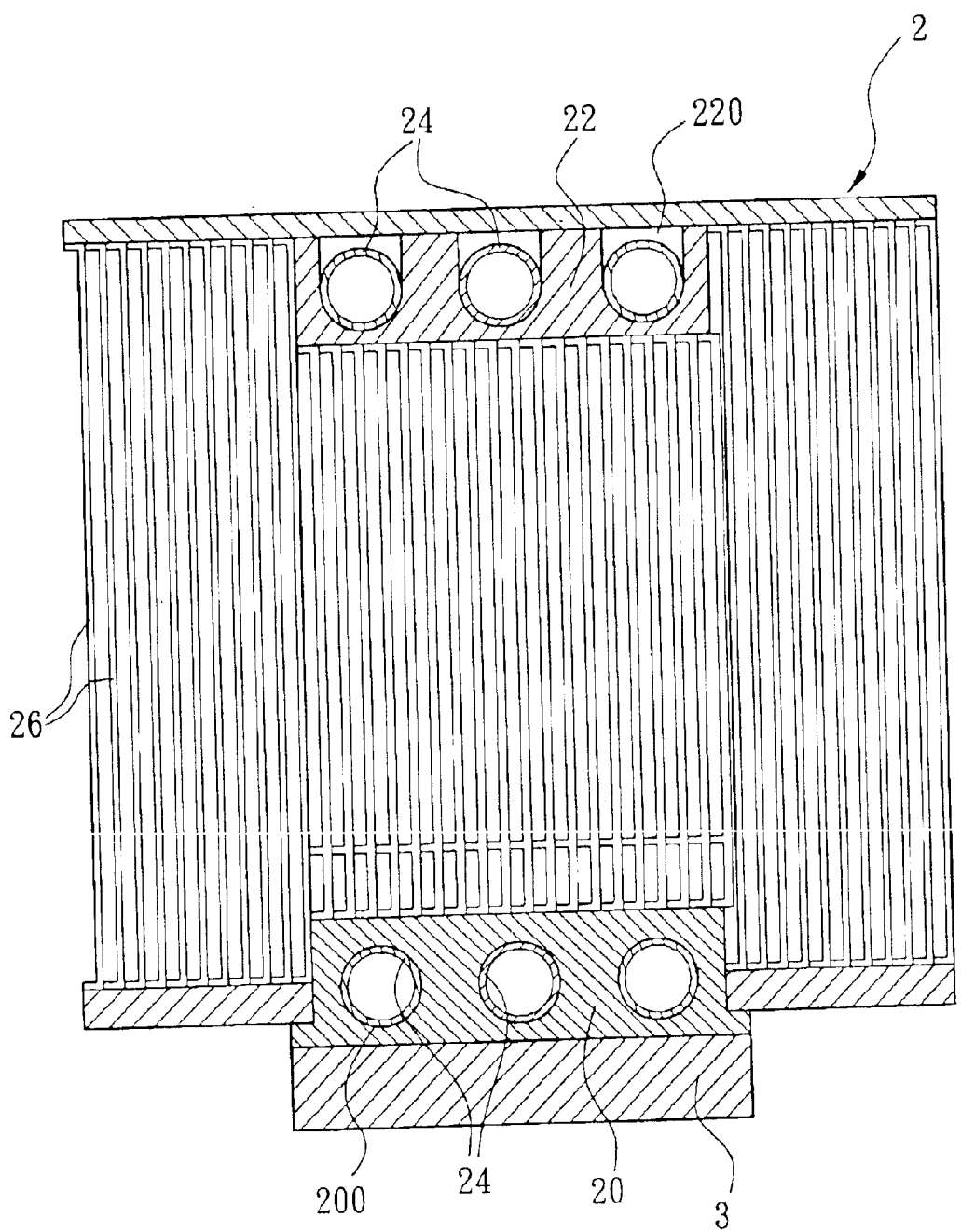
FIG. 3 is a sectional view of the beat sink module according to the present invention.

Referring to FIGS. 2 and 3, a heat sink module in accordance with the present invention is shown comprised of a base 2, a first heat conduction block 20 located on the middle of one lateral side of the base 2, a second beat conduction block 22 located on the middle of the other lateral side of the base 2, at least one (for example, three) smoothly arched heat conduction tubes 24 connected between the heat conduction blocks 20 and 22, and a plurality of radiation fins 26 arranged between. the heat conduction blocks 20 and 22. The heat conduction tubes 24 extend over the radiation fins 26, each having two ends respectively inserted into the heat conduction blocks 20 and 22. The radiation fins 26 each have two ends respectively extended to the base 2. When in use, the base 2 is fastened to a heat source 3 (for example, a semiconductor chip, CPU, etc.), keeping the first heat conduction block 20 in close contact with the heat source 3. During running of the heat source 3, the first heat conduction block 20 absorbs heat from the heat source 3, and transfers absorbed heat to the second heat conduction block 22 and then the ends of the radiation fins 26 via the heat conduction tubes 24. At the same time, an electric cooling fan (not shown) causes currents of air toward the radiation fins 26 to dissipate heat from the radiation fins 26, achieving a heat dissipation effect better than conventional designs.

The first heat conduction block 20 has at least one (for example, three) through holes 200 in one end. The bottom end of each through hole 200 extends to a distance near the other end, which is far away from the curved sections of the heat conduction tubes 24. The heat conduction tubes 24 each have one end, namely, the first end respectively inserted into the through holes 200 of the first heat conduction block 20. The second heat conduction block 22 has at least one (for example, three) guide grooves 220. The heat conduction tube 24 each have the other end, namely, the second end respectively inserted into the guide grooves 220 of the second heat conduction block 22. The first and second ends of the heat conduction tubes 24 are respectively extended into the through holes 200 of the first heat conduction block 20 and the guide grooves 220 of the second heat conduction block 22 to a certain depth, increasing the contact area between the heat conduction tubes 24 and the heat conduction blocks 20 and 22 for quick transfer of heat from the first heat conduction block 20 to the second heat conduction block 22. At the same time, the base 2 absorbs heat from the first heat conduction block 20 and the second heat conduction block 22, and transfers absorbed heat to the radiation fins 26 for quick dissipation into the air.

In order to enhance the heat transfer speed of the heat conduction blocks 20 and 22 and the heat conduction tubes 24, the heat conduction blocks 20 and 22 are respectively made of copper blocks, and the heat conduction tubes 24 are respectively made of copper tubes having a heat transfer medium for quick transfer of heat from the first heat conduction block 20 to the second heat conduction block 22, said heat transfer medium comprises pure water and mini copper nets for quick transfer of heat from said first heat conduction block to said second heat conduction block by means of an evaporation action of said pure water and a capillary effect upon absorption of heat by said first heat conduction block from the heat source to which said base is installed.

A prototype of heat sink module has been constructed with the features of FIGS. 2 and 3. The heat sink module functions smoothly to provide all of the features discussed earlier.

Although a particular embodiment of the invention has been described in detail for purposes of illustration, various modifications and enhancements may be made without departing from the spirit and scope of the invention. Accordingly, the invention is not to be limited except as by the appended claims.

What the invention claimed is:

1. A heat sink module, comprising:

a base;

a first heat conduction block located on the middle of a first side of said base;

a second heat conduction block located on the middle of a second side of said base corresponding to said first heat conduction block;

at least one heat conduction tube installed in said base between said first heat conduction block and said second heat conduction block, said at least one heat conduction tube each having two distal ends curved in one direction and respectively inserted into said first heat conduction block and said second heat conduction block; and a plurality of radiation fins located on two sides of said base and connected between said first heat conduction block and said second heat conduction block, said radiation fins each having two ends respectively extended to two sides of said base for enabling said base to be installed in a heat source.

2. The heat sink module as claimed in claim 1, wherein said first heat conduction block has at least one through hole respectively extended from a first end thereof toward a second end thereof; said second heat conduction block has at least one guide groove respectively extended from a first end thereof toward a second end thereof; said heat conduction tubes each having the respective two distal ends respectively inserted into the through holes of said first heat conduction block and the guide grooves of said second heat conduction block.

3. The heat sink module as claimed in claim 1, wherein said first heat conduction block is made of a copper block.

4. The heat sink module as claimed in claim 1, wherein said second heat conduction block is made of a copper block.

5. The heat sink module as claimed in claim 1, wherein said at least one heat conduction tube each is formed of a copper tube having a heat transfer medium therein for quick transfer of heat from said first heat conduction block to said second heat conduction block, said heat transfer medium comprising pure water and mini copper nets for quick transfer of heat from said first heat conduction block to said second heat conduction block by means of an evaporation action of said pure water and a capillary effect upon absorption of heat by said first heat conduction block from the heat source to which said base is installed.

\* \* \* \* \*